United States Patent [19]

Imai et al.

[11] Patent Number: 5,257,452
[45] Date of Patent: Nov. 2, 1993

[54] METHODS OF RECOVERING A MULTI-LAYER PRINTED CIRCUIT BOARD

[75] Inventors: Tsutomu Imai; Takashi Itoh; Takaji Takenaka, all of Hadano, Japan

[73] Assignee: Hitachi, Ltd., Tokyo, Japan

[21] Appl. No.: 886,722

[22] Filed: May 21, 1992

[30] Foreign Application Priority Data

May 27, 1991 [JP] Japan .................. 3-120762

[51] Int. Cl.$^5$ .............................. H05K 3/02
[52] U.S. Cl. .................. 29/846; 29/852; 29/402.04; 29/402.06; 29/402.11; 174/265; 174/266
[58] Field of Search ........... 29/402.09, 402.11, 402.06, 29/402.04, 852, 896; 174/265, 266; 29/852, 846

[56] References Cited

U.S. PATENT DOCUMENTS 3,334,395  8/1967  Cook et al. ................. 29/852
3,462,832  8/1969  Kubik ........................ 29/852

FOREIGN PATENT DOCUMENTS 1-139095   6/1986  Japan .
62-186597  8/1987  Japan .
1-266788  10/1989  Japan .

Primary Examiner—Carl J. Arbes
Attorney, Agent, or Firm—Fay, Sharpe, Beall, Fagan, Minnich & McKee

[57] ABSTRACT

A through hole is formed by a drill in a defective through hole in a board. An insulating resin is coated on the inner surface of the through hole and a cylindrical conductor is closely fixed with an adhesive to the hole h1 to form a reproduced through hole. Thereafter, as usual, a part lead is inserted into and soldered in the reproduced through hole to thereby recover the connection of the lead with the wiring circuit copper foil impaired by the recovering operation of the defective through hole using an external lead.

8 Claims, 2 Drawing Sheets

METHODS OF RECOVERING A MULTI-LAYER PRINTED CIRCUIT BOARD

BACKGROUND OF THE INVENTION

The present invention relates to methods of recovering multi-rater printed circuit boards, and more particularly to a method of recovering a multi-layer printed circuit board by recovery of defective through holes in the circuit board.

For example, a multi-layer printed circuit board on which many electronic parts are mounted when an electronic computer system is constructed has recently been required to increase in density and the number of layers. Therefore, the circuits formed on the board become denser and the spacings between the formed through holes and the circuit patterns on the inner layer have more and more been reduced.

If a small foreign matter of metal intervenes at a position on a multi-layer printed circuit board where the through hole is provided, those through holes and other circuits are put in a short-circuited state. Under such situation, such board cannot be used and must be dumped as a bad one, which is one of the causes which reduce a yield in the process of manufacturing such boards.

In order to prevent a decrease in the yield of such circuit boards, for example, JP-A 62-186597 discloses a recovering method of cutting a defective through hole into a through hole having a predetermined diameter, providing a conductor which extends through a solid resin along the through hole, and connecting circuits provided on each end of the conductor and on each of the opposite surfaces of the multi-layered printed board to thereby form a through hole circuit.

SUMMARY OF THE INVENTION

It is an object of the present invention to provide a method of recovering a multi-layer printed circuit board, which is capable of easily reproducing a defective through hole in a multi-layer printed circuit board whose thickness has increased due to an increase in the number of wiring layers.

It is another object of the present invention to provide a method of recovering a multi-layer printed circuit board, which is capable of reproducing a defective through hole without changing and restricting a method of attaching electronic parts before and after the recovery.

The present invention will be described hereinafter.

The above prior art is means effective for recovering through holes used as mere medium holes, but does not involve what is called an inserting and attaching system wherein leads of electronic parts or lead pins of connectors attached on a multi-layer printed circuit board are directly inserted into and connected to defective through holes. Especially, if the thickness of the board is greater than the length of the part leads and no part leads are exposed on an opposite surface of the board, no wire connection is achieved. Thus, recovery and formation of a circuit attendant to the through holes is difficult.

The present invention will be described from a different standpoint. Recently, the density of a multi-layer printed circuit board has increased, which has increased the number of multi-layer wiring layers. Thus, the thickness of the board tends to increase. The parts are required to be standardized, and it is difficult to increase the length of part leads in accordance with the thickness of the circuit board. Therefore, the length of the part leads tends to be shortened compared to the thickness of the board. The present invention is intended to provide a method of recovering a multi-layer circuit board which is increased in thickness.

The present invention relates to the solution of such problems. The summary of typical ones of the present invention disclosed in this description will be given below.

In a multi-layer printed circuit board with a plurality of wiring layers thereon and intervening insulating layers in the wiring layers, and with through holes in the layers being used for making at least one of connections between the respective wiring layers, support of mounted electronic parts, and connections between the electronic parts and the respective wiring layers, a method of recovering a multi-layer printed circuit board according to the present invention comprises providing a first through hole having a diameter larger than that of a defective through hole at the position of the defective through hole, covering the inner peripheral surface of the first through hole with an insulating material, and inserting a cylindrical conductor into the first through hole to reproduce a defective through hole.

In a multi-layer printed circuit board with a plurality of wiring layers thereon and intervening insulating layers in the wiring layers, and with through holes in the layers being used for making at least one of connections between the respective wiring layers, supports of mounted electronic parts, and connections between the electronic parts and the respective wiring layers, a method of recovering a multi-layer printed circuit board according to the present invention comprises providing a first through hole having a diameter larger than that of a defective through hole at the position of the defective through hole, covering the inner peripheral surface of the first through hole with an insulating material, inserting a conductor pin into the first through hole and providing a third through hole in the conductor pin to reproduce a defective through hole.

A method of recovering multi-layer printed circuit board according to the present invention comprises coating a first through hole with a cylindrical insulating resin to thereby cover the inner periphery of the first through hole with the insulating material.

A method of recovering a multi-layer printed circuit board according to the present invention comprises filing a first through hole temporarily with an insulating resin, providing a second through hole in the insulating resin to cover the inner periphery of the first through hole with the insulating resin.

According to the inventive recovering method, the insulating material on the inner surface of the first through hole provided at the position of the defective through hole prevents a short circuit of an inner wiring layer exposed by forming the first through hole with the cylindrical conductor and increases the adhesiveness of the insulating material with the cylindrical conductor. The cylindrical conductor inserted in the first through hole or the conductor pin in which the third through hole is provided maintain the through state after the recovery.

Thus, leads of the electronic parts or leads of the connecter can be easily soldered by inserting and attaching leads of the parts or connecters into the reproduced through holes in the circuit board as before the recovery. Since solder in the cylindrical conductor appears on the rear of the board also in the subsequent wiring, recovery of wiring involving the wire connection on the rear side of the board is easily achieved.

As described above, the advantages produced by the present invention are as follows.

According to the inventive method, defective through holes can easily be reproduced.

According to the inventive method, through holes can be reproduced without changing and restricting a method of attaching electronic parts.

DESCRIPTION OF THE PREFERRED EMBODIMENT

One embodiment of a method of recovering a multi-layer printed circuit board according to the present invention will be described in detail with reference to the drawings.

FIGS. 1A-1E are cross-sectional views schematically illustrating in the performed order of steps one example of a process for reproducing a defective through hole in a method of recovering a multi-layer printed circuit board of the present embodiment.

Figure 1A:
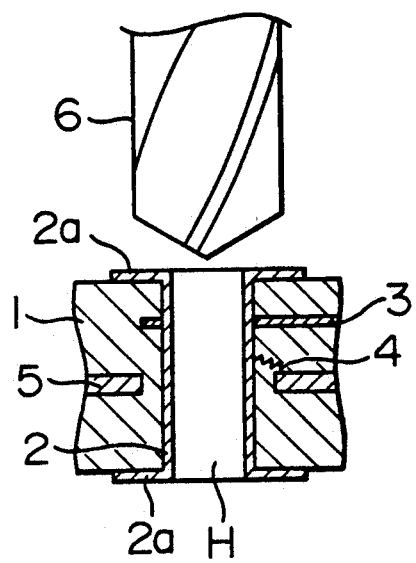
FIGS. 1A-1E are side cross-sectional views of part of a multi-layer printed circuit board as one embodiment of the present invention, illustrating in the order of processes one example of a method of recovering the board.

As shown in FIG. 1A, a multi-layer printed circuit board of the present embodiment before recovery has a structure in which, for example, wiring circuit copper foils 3 and power source supply inner layer copper foils 5 are layered in a desired pattern in the thickness of the board in an electrically insulated state.

In the board 1, a through hole (defective through hole) H is provided, which extends through the thickness of the board 1, at a position which corresponds to the position of extension of the copper foil 3 and other than the position of extension of power source inner layer copper foil 5. The inner peripheral surface of through hole H is covered with a copper foil 2. A through hole pad 2a integral with through hole 2 is formed around each of the opposite openings of the through hole H in the board 1.

The copper foil 2 and pads 2a should properly be electrically conductive with the inner copper foil 3 whose cut surface is exposed on the inner peripheral surface of the through hole H and should be insulated from the copper foil 5 which is not exposed on the inner periphery of the through hole H.

FIG. 1A shows defective through hole H in which a foreign metal substance 4 existing in the board 1 intervenes between the foils 5 and 2 which should properly be electrically insulated from each other to thereby put those foils in a short-circuited state. The present embodiment will be described with respect to recovery of such defective through hole H.

Figure 1B:
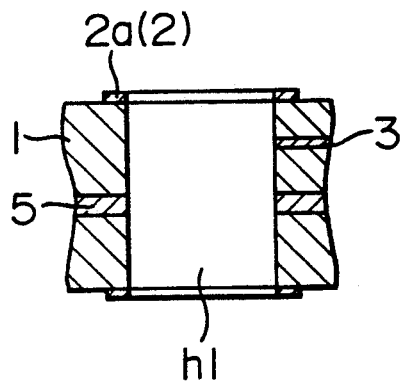

As shown in FIG. 1A, by providing a through hole h1 (first through hole) having a predetermined diameter is provided by a drill 6 having a diameter larger than that of the defective through hole H at the position of the through hole H to thereby eliminate the foreign metal 4 which is the cause of short circuit, the copper foil 2, part of the copper foil 3 and the copper foil 5 with the peripheral portions of through the hole pads 2a being left as it is (FIG. 1B). Under such condition shown in FIG. 1B, if copper refuse due to cutting adheres to the inner surface of the hole h1, it is eliminated mechanically or chemically.

Figure 1C:
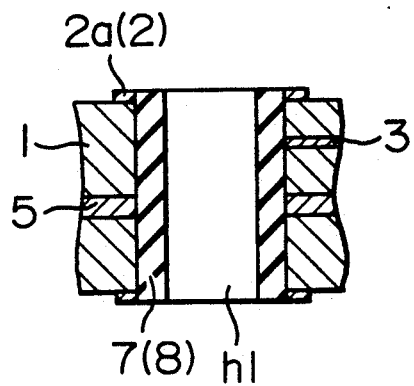
Figure 2A:
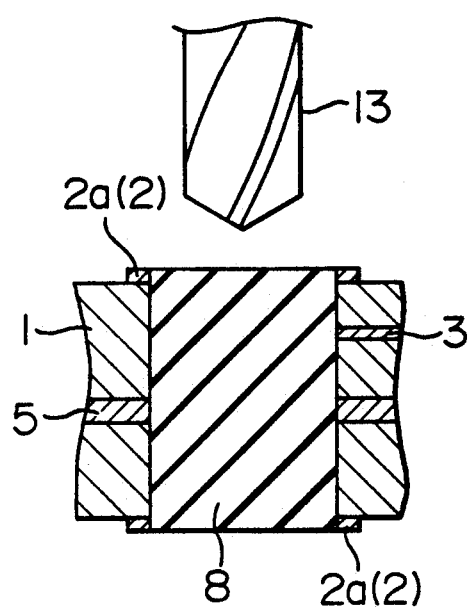
FIGS. 2A-2B are side cross-sectional views of part of a circuit board, indicating in the order of processes a modification of a method of insulating the inner periphery of a through hole provided at the position of a defective through hole.
Figure 2B:
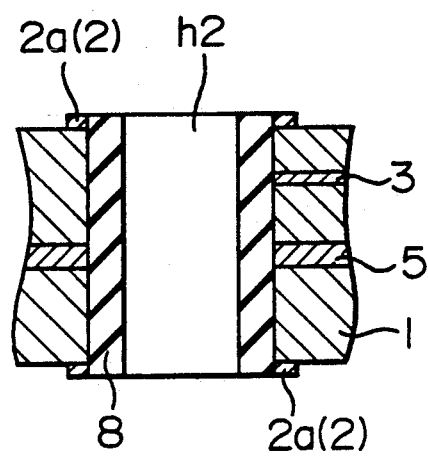

As shown in FIG. 1C, the inner surface of the hole h1 is coated with an insulating resin 7 or the like. In this case, as shown in FIGS. 2A, 2B, the hole h1 is completely filled with a thermosetting insulating resin, for example, a resist resin 8. Thereafter, a through hole h2 (second through hole) having a diameter smaller than that of the drill 6 is provided such that cylindrical resist resin 8 is left on the inner periphery of the hole h1.

Figure 1D:
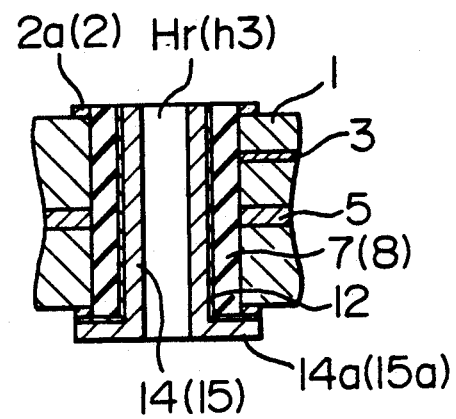

As shown in FIG. 1D, cylindrical conductor 14 having a predetermined size is inserted into the hole h1 (h2) FIG. 1B to form a reproduced through hole Hr. At this time, an adhesive 12 or an insulating resin is beforehand coated on the outer periphery of the cylindrical conductor 14 to ensure that the conductor 14 adheres and fixes to the resin 7 (resist resin 8) covering the inner surface of the hole h1 (h2). A through hole pad 14a is formed integrally at the opposite openings of the cylindrical conductor 14 on the opposite surfaces of the board 1, as required. When the rear of the board 1 is caused to contact a flow of solder (not shown) for soldering purposes, the through hole pad 14a improves its wettability to solder and facilitates the ingress of solder into the reproduced through hole Hr.

Figure 3A:
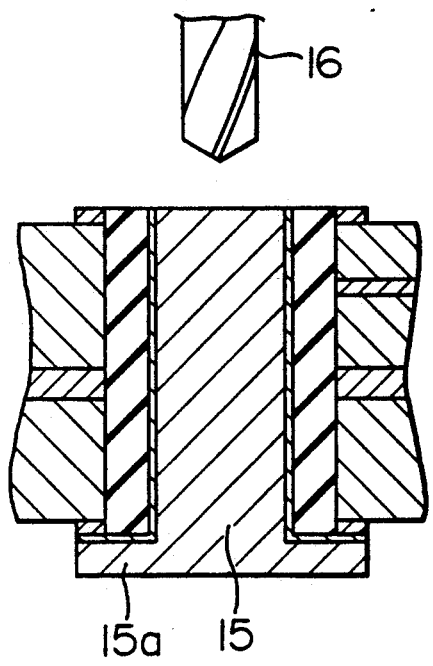
FIGS. 3A-3B are side cross-sectional view of part of a circuit board, indicating in the order of processes a method of providing a through hole in a conductive pin and forming a cylindrical conductor.
Figure 3B:
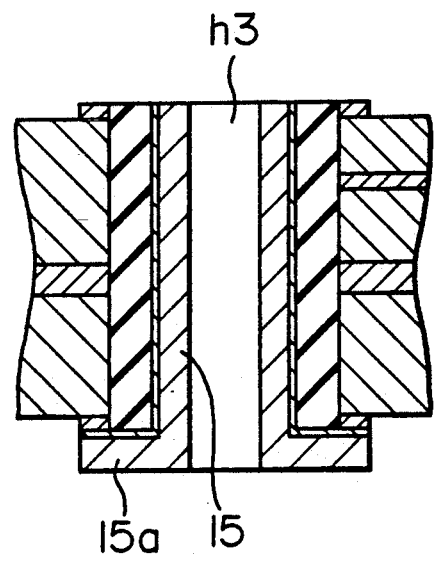

As illustrated in FIGS. 3A and 3B, after conduct pin 15 with the through hole pad 15a is inserted into the through hole h1 in place of the cylindrical conductor 14, a through hole h3 (third through hole) may be formed in the conductor pin 15 by a drill 16.

While in the present embodiment as illustrated in FIG. 1D the through hole pad 14a is provided on one side of the cylindrical conductor 14, the through hole pad 14a may have any form and size as long as it does not influence later soldering, of course.

Figure 1E:
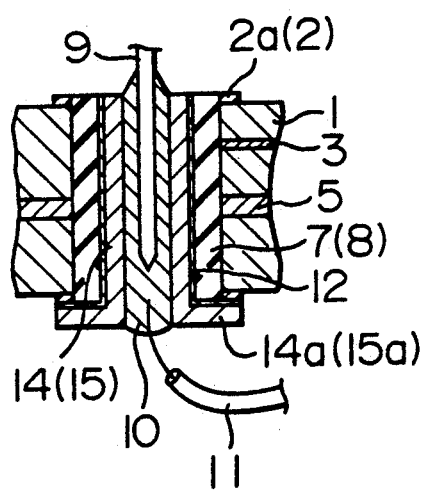

A desired electric part or a conductive connection of electric parts such as the lead 9 of a connecter is inserted into and soldered in the reproduced through hole Hr formed in the board 1, as shown in FIG. 1E, as in an ordinary defectless through hole H to thereby connect with solder 10 the cylindrical conductor 14 and the part lead 9 in the reproduced hole Hr. In the present embodiment, the method of attaching a part into the through hole H (reproduced through hole Hr) before and after the recovery is not changed and restricted.

Thereafter, by connecting through an external lead another defectless through hole H and reproduced through hole Hr which is electrically conductive with the wiring circuit copper foil 3 to thereby recover the electrical connection between the wiring circuit copper foil 3 and the defective through hole H (reproduced through hole Hr) impaired by a recovering operation such as provision of the through hole h1 as mentioned above. The connection of the external lead 11 can be easily performed by inserting an end of the external lead 11 into the solder 10 since the solder 10 used for connection of the part lead 9 is exposed on the opposite side of the board from its surface on which the part lead 9 is attached through an opening of the cylindrical conductor 14.

While the present invention is described specifically with reference to its embodiment, the present invention is not limited to the embodiment, and various changes and modifications are possible in the scope of the present invention without departing from its spirit, of course.

For example, the cross section of the cylindrical conductor is not limited to a circle, but may be any form such as an ellipse or a polygon.

In order to provide the first-third through holes, a laser beam may be used in place of a drill.

The board 1 is made, for example, of a glass epoxy material, glass polyimide material or an organic material. The thickness of the board 1 used in the present invention may be more than 6 mm, for example, 7 mm while the thickness of the conventional board 1 is 2-3 mm. Thus, the thickness of the board in the present invention is twice or more the thickness of the conventional printed circuit board.

What is claimed is:

1. A method of salvaging a defective multi-layer printed circuit board which has a plurality of wiring layers and interlacing insulating layers therein, said circuit board having a hole through the layers used for making at least one electrical connection between at least two of the plurality of wiring layers, for supporting a mounted electronic part, and for making at least one electrical connection between the electronic part and one of the plurality of wiring layers, the method comprising the steps of:

forming a first through hole having a diameter larger than that of a defective through hole at the position of the defective through hole to eliminate the defect;

covering the inner peripheral surface of the first through hole with an insulating material; and inserting a tube conductor having electrical conductivity into the insulated first through hole.

2. A method according to claim 1, wherein covering the inner peripheral surface further comprises the step of coating the first through hole with a cylindrical insulating resin to cover the inner periphery of the first through hole with the insulating material.

3. A method according to claim 1, wherein covering the inner peripheral surface further comprises the step of coating the first through hole with a cylindrical insulating resin to cover the inner periphery of the first through hole with the insulating material.

4. A method according to claim 1, further comprising the step of:

soldering at least one of a conductive connection of the electric part and a wiring lead to the tube conductor.

5. A method of recovering a multi-layer printed circuit board with a plurality of wiring layers thereon through intervening insulating layers, said circuit board having a through hole in the layers used for making at least one of connections between the respective wiring layers, support of mounted electronic parts, and connections between the electronic parts and the respective wiring layers, the method comprising the steps of:

providing a first through hole having a diameter larger than that of a defective through hole at the position of the defective through hole to eliminate the defect;

covering the inner peripheral surface of the first through hole with an insulating material;

inserting a conductor pin having an electrical conductivity into the first through hole; and forming a second through hole in the conductor pin.

6. A method according to claim 5, comprising the step of coating the first through hole with a cylindrical insulating resin to thereby cover the inner periphery of the first through hole with the insulating material.

7. A method according to claim 5, comprising the step of filling the first through hole temporarily with an insulating resin, and providing a third through hole in the insulating resin to cover the inner periphery of the first through hole with the insulating resin.

8. A method according to claim 5, further comprising the step of:

soldering at least one of the conductive connection of the electric part and the wiring leads to the cylindrical conductor.

* * * * *